United States Patent
Tanaka et al.

(10) Patent No.: US 10,693,092 B2
(45) Date of Patent: Jun. 23, 2020

(54) PHOTOELECTRIC CONVERSION ELEMENT AND SOLAR CELL

(71) Applicants: Yuuji Tanaka, Shizuoka (JP); Tsuyoshi Matsuyama, Kanagawa (JP); Tamotsu Horiuchi, Shizuoka (JP); Takahiro Ide, Shizuoka (JP); Tokushige Kino, Shizuoka (JP); Shigeyo Suzuki, Shizuoka (JP); Naomichi Kanei, Shizuoka (JP)

(72) Inventors: Yuuji Tanaka, Shizuoka (JP); Tsuyoshi Matsuyama, Kanagawa (JP); Tamotsu Horiuchi, Shizuoka (JP); Takahiro Ide, Shizuoka (JP); Tokushige Kino, Shizuoka (JP); Shigeyo Suzuki, Shizuoka (JP); Naomichi Kanei, Shizuoka (JP)

(73) Assignee: Ricoh Company, Ltd., Tokyo (JP)

( * ) Notice: Subject to any disclaimer, the term of this patent is extended or adjusted under 35 U.S.C. 154(b) by 164 days.

(21) Appl. No.: 15/860,157

(22) Filed: Jan. 2, 2018

(65) Prior Publication Data
US 2018/0198083 A1 Jul. 12, 2018

(30) Foreign Application Priority Data
Jan. 10, 2017 (JP) .................. 2017-001988

(51) Int. Cl.
*H01L 31/044* (2014.01)
*H01L 51/42* (2006.01)
(Continued)

(52) U.S. Cl.
CPC ....... *H01L 51/4226* (2013.01); *H01G 9/2059* (2013.01); *H01L 51/006* (2013.01);
(Continued)

(58) Field of Classification Search
CPC .................. H01L 31/00–078; Y02E 10/50–60
(Continued)

(56) References Cited

U.S. PATENT DOCUMENTS

2009/0242027 A1* 10/2009 Inoue .................. H01G 9/2036
136/257
2014/0290748 A1* 10/2014 Demadrille .......... C09B 57/008
136/263

(Continued)

OTHER PUBLICATIONS

Hitoshi Kusama, Hironori Arakawa, Influence of Alkylaminopyridine Additives in Electrolytes on Dye-sensitized Solar Cell Performance, Solar Energy Materials & Solar Cells, 81, 2004, 87-99 (Year: 2004).*

(Continued)

*Primary Examiner* — Bach T Dinh
(74) *Attorney, Agent, or Firm* — Oblon, McClelland, Maier & Neustadt, L.L.P.

(57) ABSTRACT

A photoelectric conversion element is provided. The photoelectric conversion element comprises a substrate, a first electrode, an electron transport layer, a hole transport layer, and a second electrode. The electron transport layer comprises a photosensitizing compound. The hole transport layer comprises a basic compound A and an ionic compound B. The basic compound A is represented by the following formula (1):

Formula (1)

(Continued)

where each of $R_1$ and $R_2$ independently represents an alkyl group or an aromatic hydrocarbon group, or $R_1$ and $R_2$ share bond connectivity to form a nitrogen-containing heterocyclic ring; and the ionic compound B is represented by the following formula (2):

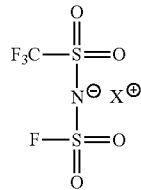

Formula (2)

where $X^+$ represents a counter cation.

11 Claims, 2 Drawing Sheets

(51) Int. Cl.
*H01G 9/20* (2006.01)
*H01L 51/00* (2006.01)
*H01L 31/0256* (2006.01)

(52) U.S. Cl.
CPC ...... *H01L 51/0061* (2013.01); *H01L 51/0072* (2013.01); *H01L 2031/0344* (2013.01); *Y02E 10/549* (2013.01)

(58) Field of Classification Search
USPC .................................................. 136/243–265
See application file for complete search history.

(56) References Cited

U.S. PATENT DOCUMENTS

| | | |
|---|---|---|
| 2015/0279573 A1 | 10/2015 | Horiuchi et al. |
| 2016/0126021 A1 | 5/2016 | Tanaka et al. |
| 2016/0218308 A1* | 7/2016 | Desilvestro ........... H01L 51/422 |
| 2016/0276609 A1 | 9/2016 | Horiuchi et al. |
| 2017/0069431 A1 | 3/2017 | Tanaka et al. |
| 2017/0092433 A1 | 3/2017 | Kanei et al. |
| 2017/0222150 A1 | 8/2017 | Arai et al. |
| 2017/0243698 A1 | 8/2017 | Kanei et al. |
| 2017/0358399 A1 | 12/2017 | Matsuyama et al. |
| 2018/0241082 A1* | 8/2018 | Suzuki .................... H01M 2/16 |

OTHER PUBLICATIONS

U.S. Appl. No. 15/730,815, filed Oct. 12, 2017, Yuuji Tanaka, et al.

Tadas Malinauskas, et al., "Enhancing Thermal Stability and Lifetime of Solid-State Dye-Sensitized Solar Cells via Molecular Engineering of the Hole-Transporting Material Spiro-OMeTAD" ACS Appl. Mater. Interfaces 2015, 7, 11107-11116.

Yoshiaki Oku, "Development of High-efficiency Energy Harvesting Device and Stand-alone Power System for Indoor Illumination Environment" The Journal of the Institute of Electrical Engineers of Japan, vol. 133 (2013) Issue 4 pp. 214-217(with English Translation).

* cited by examiner

PHOTOELECTRIC CONVERSION ELEMENT AND SOLAR CELL

CROSS-REFERENCE TO RELATED APPLICATIONS

This patent application is based on and claims priority pursuant to 35 U.S.C. § 119(a) to Japanese Patent Application No. 2017-001988, filed on Jan. 10, 2017 in the Japan Patent Office, the entire disclosure of which is hereby incorporated by reference herein.

BACKGROUND

Technical Field

The present disclosure relates to a photoelectric conversion element and a solar cell.

Description of the Related Art

In recent years, the driving power for an electronic circuit has become extremely small. It is now possible to drive various types of electronic components, such as sensors, with weak electric power. For utilizing sensors, stand-alone power sources (environmental power generating elements) that can generate and consume power on the spot are expected. In particular, solar cells are attracting attention as elements that can generate power anywhere there is light.

Among the solar cells, it is known that solid-state dye-sensitized solar cells remarkably degrade power generating ability under high-temperature environments due to crystallization of the hole transport layer. In attempting to solve this problem, one proposed approach involves suppressing the crystallization by increasing steric hindrance by, for example, introducing an alkyl group to the molecular backbone of the hole transport material. On the other hand, it has been reported that current loss due to internal resistance of a photoelectric conversion element is remarkable when weak light, such as indoor light, is converted to electricity.

Heat resistance of such solid-state dye-sensitized solar cells has been evaluated under pseudo sunlight so far. That evaluated under weak light, such as room light, has never been reported. Stand-alone power sources will be more demanded in the future, for sensors installed in high-temperature environments where no one will step in. A power generating element for driving electronic components needs to generate a certain level of voltage. A reduction of the generated power (voltage) may cause defective driving of the electronic components.

SUMMARY

In accordance with some embodiments of the present invention, a photoelectric conversion element is provided. The photoelectric conversion element comprises a substrate, a first electrode, an electron transport layer, a hole transport layer, and a second electrode. The electron transport layer comprises a photosensitizing compound. The hole transport layer comprises a basic compound A and an ionic compound B. The basic compound A is represented by the following formula (1):

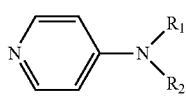

Formula (1)

where each of $R_1$ and $R_2$ independently represents an alkyl group or an aromatic hydrocarbon group, or $R_1$ and $R_2$ share bond connectivity to form a nitrogen-containing heterocyclic ring; and the ionic compound B is represented by the following formula (2):

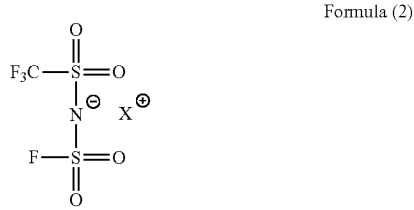

Formula (2)

where $X^+$ represents a counter cation.

In accordance with some embodiments of the present invention, a solar cell is provided. The solar cell comprises the above photoelectric conversion element.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

Figure 1:
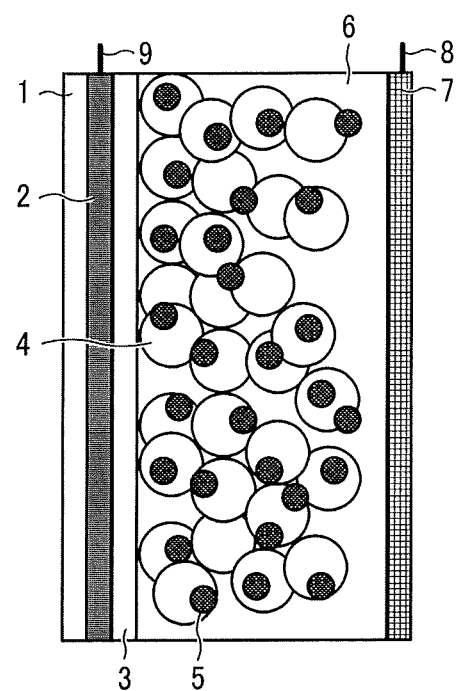
FIG. 1 is a cross-sectional view of a photoelectric conversion element in accordance with some embodiments of the present invention.

The accompanying drawings are intended to depict example embodiments of the present invention and should not be interpreted to limit the scope thereof. The accompanying drawings are not to be considered as drawn to scale unless explicitly noted.

DETAILED DESCRIPTION

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Embodiments of the present invention are described in detail below with reference to accompanying drawings. In describing embodiments illustrated in the drawings, specific terminology is employed for the sake of clarity. However, the disclosure of this patent specification is not intended to be limited to the specific terminology so selected, and it is to be understood that each specific element includes all technical equivalents that have a similar function, operate in a similar manner, and achieve a similar result.

For the sake of simplicity, the same reference number will be given to identical constituent elements such as parts and materials having the same functions and redundant descriptions thereof omitted unless otherwise stated.

In accordance with some embodiments of the present invention, a photoelectric conversion element is provided that is capable of suppressing voltage reduction and producing high power output even under high-temperature and weak-light environments.

The photoelectric conversion element in accordance with some embodiments of the present invention comprises a substrate, a first electrode, an electron transport layer comprising, a hole transport layer, and a second electrode. The electron transport layer comprises a photosensitizing compound. The hole transport layer comprises a basic compound A represented by the following formula (1) and an ionic compound B represented by the following formula (2).

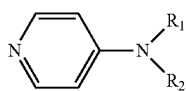

Formula (1)

In the formula (1), each of $R_1$ and $R_2$ independently represents an alkyl group or an aromatic hydrocarbon group, or $R_1$ and $R_2$ share bond connectivity to form a nitrogen-containing heterocyclic ring.

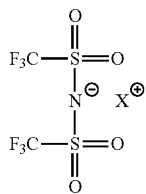

Formula (2)

In the formula (2), $X^+$ represents a counter cation.

By using the combination of the basic compound A and the ionic compound B, the photoelectric conversion element can suppress voltage reduction and produce high power output even under high-temperature environments. The high-temperature environments may refer to, for example, environments having a temperature of 40° C. or higher.

The photoelectric conversion element can suppress voltage reduction and produce high power output even under weak light such as indoor light.

The photoelectric conversion element and solar cell in accordance with some embodiments of the present invention are described below with reference to FIG. 1. FIG. 1 is a cross-sectional view of a photoelectric conversion element in accordance with some embodiments of the present invention.

Referring to FIG. 1, a first electrode 2 is formed on a substrate 1. A hole blocking layer 3 is formed on the first electrode 2. An electron transport layer 4, containing a photosensitizing compound 5, is formed on the hole blocking layer 3. A second electrode 7 is disposed facing the first electrode 2, and a hole transport layer 6 is disposed therebetween. In addition, lead lines 8 and 9 for electrically connecting the first electrode 2 and the second electrode 7 are provided.

Substrate

The substrate 1 is not limited to any particular material. Preferably, the substrate 1 is made of a transparent material, such as a glass plate, a transparent plastic plate, a transparent plastic film, and an inorganic transparent crystalline body.

First Electrode

The first electrode 2 is made of a visible-light-transmissive conductive material. Examples of the visible-light-transmissive conductive material include those conventionally used for photoelectric conversion elements and liquid crystal panels.

Specific examples of such materials used for the first electrode 2 include, but are not limited to, indium-tin oxide (ITO), fluorine-doped tin oxide (FTO), antimony-doped tin oxide (ATO), indium-zinc oxide, niobium-titanium oxide, and graphene. Each of these substances may be used alone to form a single layer or in combination with others to form a multilayer.

Preferably, the first electrode has a thickness of from 5 nm to 10 μm, and more preferably from 50 nm to 1 μm.

To maintain a constant level of rigidity, the first electrode 2 is preferably formed on the substrate 1 made of a visible-light-transmissive material such as a glass plate, a transparent plastic plate, a transparent plastic film, and an inorganic transparent crystalline body.

A combined body of the first electrode 2 and the substrate 1 may also be used. Examples of such a combined body include, but are not limited to, an FTO-coated glass plate, an ITO-coated glass plate, a zinc-oxide-and-aluminum-coated glass plate, an FTO-coated transparent plastic film, and an ITO-coated transparent plastic film.

In addition, a combined body of a substrate (such as glass substrate) with a transparent electrode made of tin oxide or indium oxide doped with a cation or anion having a different atomic valence, or with a metallic electrode having a mesh-like or stripe-like structure to be light transmissive, can also be used.

Each of these materials can be used alone, or mixed with or laminated on the others.

For the purpose of reducing resistance, metallic lead wires may be used in combination. The metallic lead wire may be made of aluminum, copper, silver, gold, platinum, or nickel. The metallic lead wire may be disposed to the substrate by means of vapor deposition, sputtering, or pressure bonding, and ITO or FTO may be further disposed thereon.

Hole Blocking Layer

The hole blocking layer 3 is preferably made of a visible-light-transmissive material. Examples of such a material include an electron transport material. Preferred examples of the electron transport material include titanium oxide. The hole blocking layer 3 is provided for suppressing voltage reduction that is caused when a hole in an electrolyte and an electron on the surface of the electrode are recombined (i.e., reverse electron transfer occurs) as the electrolyte comes into contact with the electrode. The effect of the hole blocking layer 3 is remarkably exerted especially in a solid-state dye-sensitized solar cell. This is because, in a solid-state dye-sensitized solar cell generally containing an organic hole transport material, the recombination (reverse electron transfer) speed of a hole in the hole transport material with an electron on the surface of the electrode is greater than that in a wet-state dye-sensitized solar cell containing an electrolytic solution.

The hole blocking layer 3 is preferably formed by a method that can impart a high internal resistance to the resulting hole blocking layer so as to suppress current loss under indoor light, but the forming method is not limited thereto. Generally, the hole blocking layer can be formed by a sol-gel method that is one of wet film-forming methods. However, the film formed by this method cannot sufficiently suppress current loss because the film density is low. On the other hand, the film formed by sputtering, that is one of dry film-forming methods, can suppress current loss since the film density is sufficiently high.

The hole blocking layer 3 has another function of preventing the first electrode 2 and the hole transport layer 6 from electrically contacting with each other. Preferably, the thickness of the hole blocking layer 3 is from 5 nm to 1 μm, but is not limited thereto. When the hole blocking layer is formed by a wet film-forming method, the preferred thickness is from 500 to 700 nm. When the hole blocking layer is formed by a dry film-forming method, the preferred thickness is from 10 to 30 nm.

Electron Transport Layer

The electron transport layer 4 contains the photosensitizing compound 5. The electron transport layer 4 may have a configuration in which the photosensitizing compound 5 is adsorbed to an electron transport material. In the present embodiment, the electron transport layer 4 is porous and formed on the hole blocking layer 3. The electron transport layer 4 may be either single-layered or multi-layered.

In the latter case, multiple dispersion liquids containing semiconductor particles of different particle diameters may be applied multiply, or multiple layers of different kinds of semiconductors or different compositions of resins and additives may be applied multiply. In a case in which the thickness is insufficient as a result of single application, multiple application is effective.

Generally, as the thickness of the electron transport layer 4 increases, the amount of photosensitizing materials carried per unit projected area increases, and therefore the light capture rate increases. However, at the same time, the diffusion distance of injected electrons also increases, thus increasing loss due to recombination of charge.

Accordingly, the thickness of the electron transport layer 4 is preferably in the range of from 100 nm to 100 μm.

In a case in which a semiconductor is used as the electron transport material, the semiconductor is not limited to any particular material. Specific examples of the semiconductor include, but are not limited to, single-body semiconductors such as silicon and germanium, compound semiconductors such as metal chalcogenides, and compounds having a perovskite structure.

Specific examples of the metal chalcogenides include, but are not limited to, oxides of titanium, tin, zinc, iron, tungsten, zirconium, hafnium, strontium, indium, cerium, yttrium, lanthanum, vanadium, niobium, and tantalum; sulfides of cadmium, zinc, lead, silver, antimony, and bismuth; selenides of cadmium and lead; and tellurides of cadmium.

Specific examples of the compound semiconductors include, but are not limited to, phosphides of zinc, gallium, indium, and cadmium; gallium arsenide; copper-indium selenide; and copper-indium sulfide.

Specific examples of the compounds having a perovskite structure include, but are not limited to, strontium titanate, calcium titanate, sodium titanate, barium titanate, and potassium niobate.

Among these materials, oxide semiconductors are preferable, and titanium oxide, zinc oxide, tin oxide, and niobium oxide are more preferable. Each of these materials can be used alone or in combination with others. The semiconductor is not limited in crystal type and may be either single crystalline, polycrystalline, or amorphous.

In a case in which semiconductor particles are used as the electron transport material, the semiconductor particles are not limited in size. Preferably, the average particle diameter of the primary particle thereof is in the range of from 1 to 100 nm, more preferably from 5 to 50 nm.

It is possible to further improve efficiency by mixing or stacking another type of semiconductor particles having a greater average particle diameter so that incident light can scatter. In this case, the average particle diameter of the semiconductor particles is preferably in the range of from 50 to 500 nm.

The electron transport layer 4 is not limited in its formation method and can be formed by, for example, a vacuum film-forming method, such as sputtering, or a wet film-forming method. For reducing production cost, wet film-forming methods are preferable. Specifically, a method of applying a paste dispersing a powder or sol of semiconductor particles onto the hole blocking layer 3, disposed on the first electrode 2 serving as an electron collecting electrode substrate, is preferable.

In wet film-forming methods, how to apply the paste is not particularly limited. For example, the paste may be applied by means of dipping, spraying, wire bar, spin coating, roller coating, blade coating, gravure coating, or wet printing such as relief, offset, gravure, intaglio, rubber plate, and screen printings.

A dispersion liquid of semiconductor particles may be prepared by means of mechanical pulverization or mill, specifically by dispersing at least the semiconductor particles alone or a mixture of the semiconductor particles with a resin in water or an organic solvent. Specific examples of the resin mixed with the semiconductor particles include, but are not limited to, homopolymers and copolymers of vinyl compounds such as styrene, vinyl acetate, acrylate, and methacrylate; and silicone resin, phenoxy resin, polysulfone resin, polyvinyl butyral resin, polyvinyl formal resin, polyester resin, cellulose ester resin, cellulose ether resin, urethane resin, phenol resin, epoxy resin, polycarbonate resin, polyarylate resin, polyamide resin, and polyimide resin.

Specific examples of solvents for dispersing the semiconductor particles include, but are not limited to, water; alcohol solvents such as methanol, ethanol, isopropyl alcohol, and α-terpineol; ketone solvents such as acetone, methyl ethyl ketone, and methyl isobutyl ketone; ester solvents such as ethyl formate, ethyl acetate, n-butyl acetate; ether solvents such as diethyl ether, dimethoxyethane, tetrahydrofuran, dioxolan, and dioxane; amide solvents such as N,N-dimethylformamide, N,N-dimethylacetamide, and N-methyl-2-pyrrolidone; halogenated hydrocarbon solvents such as dichloromethane, chloroform, bromoform, methyl iodide, dichloroethane, trichloroethane, trichloroethylene, chlorobenzene, o-dichlorobenzene, fluorobenzene, bromobenzene, iodobenzene, and 1-chloronaphthalene; and hydrocarbon solvents such as n-pentane, n-hexane, n-octane, 1,5-hexadiene, cyclohexane, methylcyclohexane, cyclohexadiene, benzene, toluene, o-xylene, m-xylene, p-xylene, ethylbenzene, and cumene. These solvents can be used alone or in combination as a mixed solvent.

To prevent reaggregation of particles in the dispersion liquid of semiconductor particles or the paste of semiconductor particles obtained by sol-gel method, etc., an acid (e.g., hydrochloric acid, nitric acid, and acetic acid), a surfactant (e.g., polyoxyethylene(10) octyl phenyl ether), or a chelator (e.g., acetyl acetone, 2-aminoethanol, and ethylenediamine) may be added thereto.

To improve film-forming performance, a thickener can also be added.

Specific examples of the thickener include, but are not limited to, polymers such as polyethylene glycol and polyvinyl alcohol, and ethyl cellulose.

It is preferable that semiconductor particles having been applied are brought into electronic contact with each other and exposed to burning, microwave irradiation, electron beam irradiation, or laser light irradiation, for increasing the film strength and adhesion to the substrate. Each of these treatments can be conducted alone or in combination with others.

In the burning, the burning temperature is preferably in the range of from 30° C. to 700° C., more preferably from 100° C. to 600° C., but is not limited thereto. When the burning temperature is excessively raised, the resistance of the substrate may become too high or the substrate may melt. The burning time is preferably from 10 minutes to 10 hours, but is not limited thereto.

In the microwave irradiation, the electron transport layer may be irradiated from either the layer-formed side or the opposite side thereof. The irradiation time is preferably within 1 hour, but is not limited thereto.

After the burning, for the purpose of increasing the surface area of the semiconductor particles as well as increasing the efficiency of electron injection from the photosensitizing compound to the semiconductor particles, a chemical plating treatment using an aqueous solution of titanium tetrachloride or a mixed solution thereof with an organic solvent, or an electrochemical plating treatment using an aqueous solution of titanium trichloride may be conducted.

A layer in which semiconductor particles having a diameter of several tens nanometers are stacked by sintering, etc., forms a porous structure. Such a nano porous structure has a very large surface area. The surface area can be represented by a roughness factor. The roughness factor is a numerical value indicating the ratio of the actual area of the inside of the porous structure to the surface area of the semiconductor particles applied to the substrate. Accordingly, the higher the roughness factor, the better. In view of the thickness of the electron transport layer, the roughness factor is preferably 20 or more.

Photosensitizing Compound

In the present embodiment, for more improving conversion efficiency, the photosensitizing compound 5 (hereinafter may be referred to as "photosensitizing material") is adsorbed to the surface of the electron transport material contained in the electron transport layer 4.

The photosensitizing material is not limited to any particular compound so long as it is capable of being photo-excited. Specific examples of such materials include, but are not limited to, the following compounds:

metal complex compounds described in JP-07-500630-A, JP-10-233238-A, JP-2000-26487-A, JP-2000-323191-A, and JP-2001-59062; coumarin compounds described in JP-10-93118-A, JP-2002-164089-A, JP-2004-95450-A, and J. Phys. Chem. C., 7224, Vol. 111 (2007); polyene compounds described in JP-2004-95450 and Chem. Commun., 4887 (2007); indoline compounds described in JP-2003-264010-A, JP-2004-63274-A, JP-2004-115636-A, JP-2004-200068-A, JP-2004-235052-A, J. Am. Chem. Soc., 12218, Vol. 126 (2004), Chem. Commum., 3036 (2003), and Angew. Chem. Int. Ed., 1923, Vol. 47 (2008); thiophene compounds described in J. Am. Chem. Soc., 16701, Vol. 128 (2006) and J. Am. Chem. Soc., 14256, Vol. 128 (2006); cyanine dyes described in JP-11-86916-A, JP-11-214730-A, JP-2000-106224-A, JP-2001-76773-A, and JP-2003-7359-A; merocyanine dyes described in JP-11-214731-A, JP-11-238905-A, JP-2001-52766-A, JP-2001-76775-A, and JP-2003-7360-A; 9-aryl xanthene compounds described in JP-10-92477-A, JP-11-273754-A, JP-11-273755-A, and JP-2003-31273-A; triarylmethane compounds described in JP-10-93118-A and JP-2003-31273-A; and phthalocyanine compounds and porphyrin compounds described in JP-09-199744-A, JP-10-233238-A, JP-11-204821-A, JP-11-265738-A, J. Phys. Chem., 2342, Vol. 91 (1987), J. Phys. Chem. B, 6272, Viol. 97 (1993), Electroanal. Chem., 31, Vol. 537 (2002), JP-2006-032260-A, J. Porphyrins Phthalocyanines, 230, Vol. 3 (1999), Angew. Chem. Int. Ed., 373, Vol. 46 (2007), and Langmuir, 5436, Vol. 24 (2008).

Among these compounds, metal complex compounds, coumarin compounds, polyene compounds, indoline compounds, and thiophene compounds are preferable. More specifically, compounds available from Mitsubishi Paper Mills Limited under the product names D131, D102, and D358, respectively represented by the following formulae (i), (ii), and (iii), are preferable.

Formula (i)

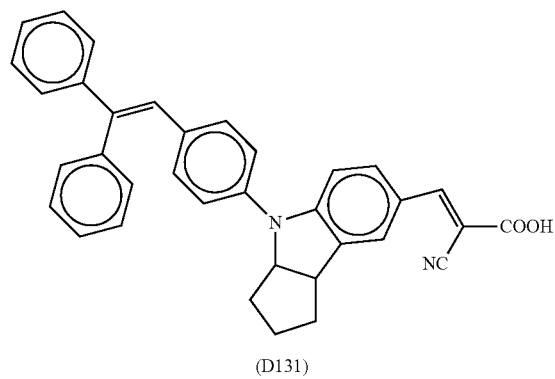

(D131)

Formula (ii)

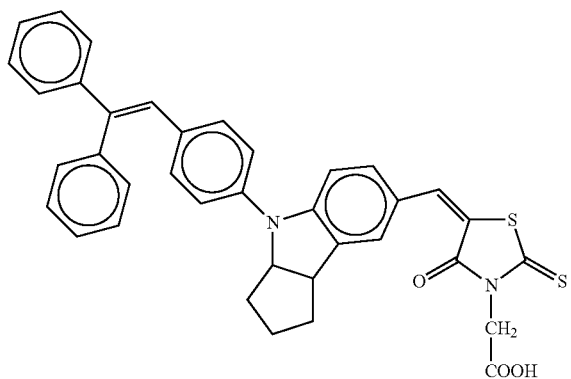

(D102)

Formula (iii)

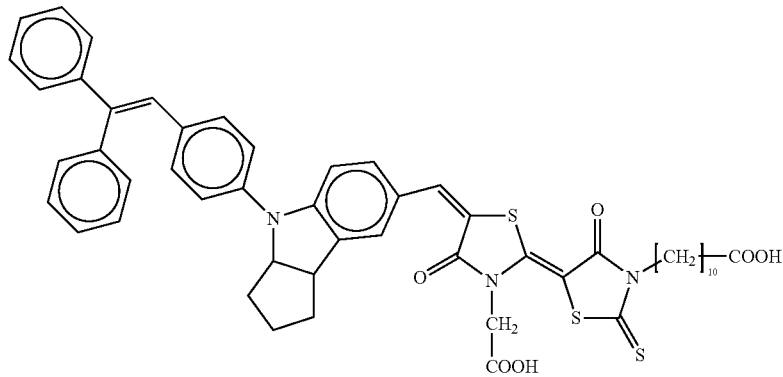

(D358)

The photosensitizing material can be adsorbed to the electron transport material contained in the electron transport layer 4 by dipping the electron collecting electrode (i.e., the first electrode 2) having the electron transport layer 4 thereon in a solution or dispersion of the photosensitizing material, or applying the solution or dispersion of the photosensitizing material to the electron transport layer 4.

In the former case, for example, an immersion method, a dipping method, a roller method, or an air knife method may be employed.

In the latter case, for example, a wire bar method, a slide hopper method, an extrusion method, a curtain method, a spin method, or a spray method may be employed.

Alternatively, the adsorption can be performed in a supercritical fluid of carbon dioxide etc.

When adsorbing the photosensitizing material to the electron transport material, a condensation agent can be used in combination.

The condensation agent may act as a catalyst for physically or chemically binding the photosensitizing material and the electron transport material to a surface of an inorganic material, or may stoichiometrically act for advantageously transfer chemical equilibrium.

Further, a condensation auxiliary agent, such as a thiol and a hydroxy compound, may be used in combination.

Specific examples of solvents for dissolving or dispersing the photosensitizing material include, but are not limited to, water; alcohol solvents such as methanol, ethanol, and isopropyl alcohol; ketone solvents such as acetone, methyl ethyl ketone, and methyl isobutyl ketone; ester solvents such as ethyl formate, ethyl acetate, and n-butyl acetate; ether solvents such as diethyl ether, dimethoxyethane, tetrahydrofuran, dioxolan, and dioxane; amide solvents such as N,N-dimethylformamide, N,N-dimethylacetamide, and N-methyl-2-pyrrolidone; halogenated hydrocarbon solvents such as dichloromethane, chloroform, bromoform, methyl iodide, dichloroethane, trichloroethane, trichloroethylene, chlorobenzene, o-dichlorobenzene, fluorobenzene, bromobenzene, iodobenzene, and 1-chloronaphthalene; and hydrocarbon solvents such as n-pentane, n-hexane, n-octane, 1,5-hexadiene, cyclohexane, methylcyclohexane, cyclohexadiene, benzene, toluene, o-xylene, m-xylene, p-xylene, ethylbenzene, and cumene. These solvents can be used alone or in combination with others.

Some photosensitizing materials more effectively work when aggregation is suppressed. Therefore, an aggregation dissociating agent can be used in combination.

Specific preferred examples of the aggregation dissociating agent include, but are not limited to, steroid compounds such as cholic acid and chenodeoxycholic acid; long-chain alkylcarboxylic acids; and long-chain alkylsulfonic acids.

The addition amount of the aggregation dissociating agent is preferably from 0.01 to 500 parts by mass, more preferably from 0.1 to 100 parts by mass, based on 1 part by mass of the photosensitizing material.

Preferably, the temperature at the adsorption of the photosensitizing material alone or a combination of the photosensitizing material and aggregation dissociating agent is in the range of from −50 to 200° C. The adsorption may be performed under either static condition or stirring.

The stirring may be performed by, for example, a stirrer, a ball mill, a paint conditioner, a sand mill, an attritor, a disperser, or an ultrasonic disperser.

The time required for the adsorption is, preferably, from 5 seconds to 1,000 hours, more preferably from 10 seconds to 500 hours, and most preferably from 1 minute to 150 hours. Preferably, the adsorption is performed in dark place.

Hole Transport Layer

The hole transport layer 6 may comprise an electrolytic solution in which a redox pair is dissolved in an organic solvent, a gel electrolyte in which an organic solvent solution of a redox pair is impregnated in a polymer matrix, a molten salt containing a redox pair, a solid electrolyte, an inorganic hole transport material, and/or an organic hole transport material. Among these, organic hole transport materials are preferable.

In the following descriptions, the hole transport layer 6 may be described as comprising an organic hole transport material, for the purpose of illustration and not limitation.

The hole transport layer 6 may have either a single-layer structure comprising a single material or a multi-layer structure comprising multiple types of materials. In a case in which the hole transport layer 6 has a multi-layer structure, it is preferable that a hole transport layer disposed close to the second electrode 7 contains a polymeric material. By using the polymeric material having high film-forming performance, the surface of the porous electron transport layer 4 can be smoothened and thereby photoelectric conversion property can be improved.

In addition, because the polymeric material hardly permeates the porous electron transport layer 4, the surface of the porous electron transport layer 4 can be sufficiently covered with the polymeric material and thereby the occurrence of short circuit is prevented and improved performance is provided.

In a case in which the hole transport layer 6 has a single-layer structure, the hole transport layer 6 may contain a known organic hole transport compound as the organic hole transport material.

Specific examples of such compounds include, but are not limited to, oxadiazole compounds described in JP-34-5466-B; triphenylmethane compounds described in JP-45-555-B; pyrazoline compounds described in JP-52-4188-B; hydrazone compounds described in JP-55-42380-B; oxadiazole compounds described in JP-56-123544-A; tetraarylbenzidine compounds described in JP-54-58445-A; and stilbene compounds described in JP-58-65440-A and JP-60-98437-A.

Specific preferred examples of the organic hole transport material include a material represented by the following formula (3). Preferably, the content rate of the organic hole transport material represented by the formula (3) in the hole transport layer 6 is from 30% to 99% by mass, and more preferably from 65% to 80% by mass.

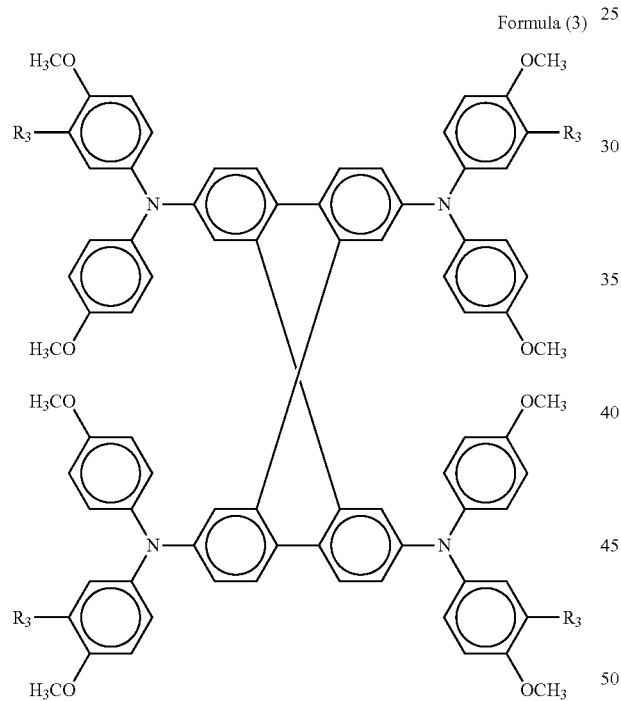

Formula (3)

In the formula (3), $R_3$ represents hydrogen atom or methyl group.

In particular, a hole transport material represented by the formula (3) when $R_3$ representing hydrogen atom, that is 2,2',7,7'-tetrakis(N,N-di-p-methoxyphenylamino)-9,9'-spirobifluorene, also known as spiro-OMeTAD, described in Adv. Mater., 813, vol. 17, 2005, is preferable, and another hole transport material represented by the formula (3) when $R_3$ representing methyl group, that is HTM1 described in ACS Appl. Mater. Interfaces, 2015, 7(21), pp. 11107-11116, is more preferable.

The spiro-OMeTAD has a high hole drift mobility and a molecular structure in which two benzidine backbone molecules are twisted and bound. Therefore, the spiro-OMeTAD forms an electron cloud having a nearly spherical shape and exhibits excellent photoelectric conversion property due to excellent hopping conductivity between molecules. In addition, the spiro-OMeTAD is highly soluble in various organic solvents. Being amorphous (i.e., having no crystalline structure), the spiro-OMeTAD can be densely packed in the porous electron transport layer 4, which is an advantageous property for solid-state dye-sensitizing solar cells. Furthermore, having no light-absorbing property at wavelengths equal to and greater than 450 nm, the spiro-OMeTAD can allow the photosensitizing material to effectively absorb light, which is also an advantageous property for solid-state dye-sensitizing solar cells.

The HTM1 has an advantageous property such that crystallization can be suppressed under high-temperature environments by increasing steric hindrance by introducing an alkyl group to the molecular backbone thereof.

Preferred examples of the inorganic hole transport material include metal complex salts. A metal complex salt generally comprises a metal cation, a ligand, and an anion. Specific examples of the metal complex salt include all possible combinations of metal cations, ligands, and anions exemplified below. Specific examples of the metal cation in the metal complex salt include, but are not limited to, cations of chromium, manganese, iron, cobalt, nickel, copper, molybdenum, ruthenium, rhodium, palladium, silver, tungsten, rhenium, osmium, iridium, gold, and platinum. Among these, cations of chromium, iron, nickel, and copper are preferable.

Specific examples of the ligand for forming the metal complex salt include, but are not limited to, the following compounds (A-01) to (A-28). Each of these compounds can be used alone or in combination with others.

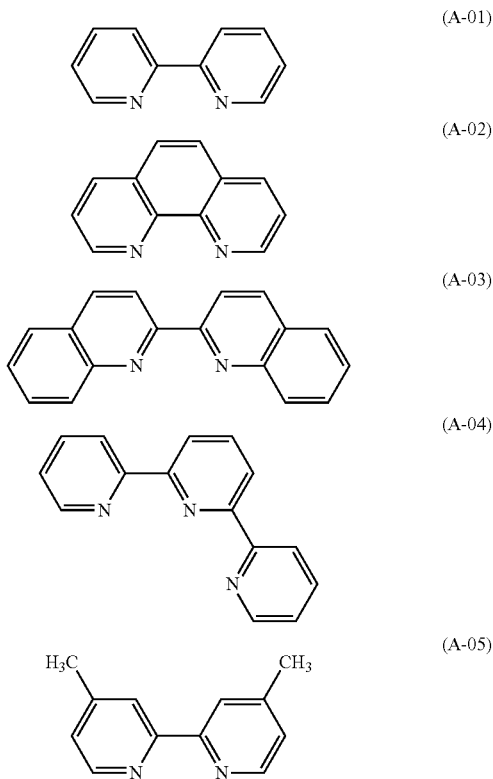

-continued (A-06), (A-07), (A-08), (A-09), (A-10), (A-11), (A-12), (A-13), (A-14), (A-15), (A-16), (A-17), (A-18), (A-19), (A-20), (A-21)

-continued

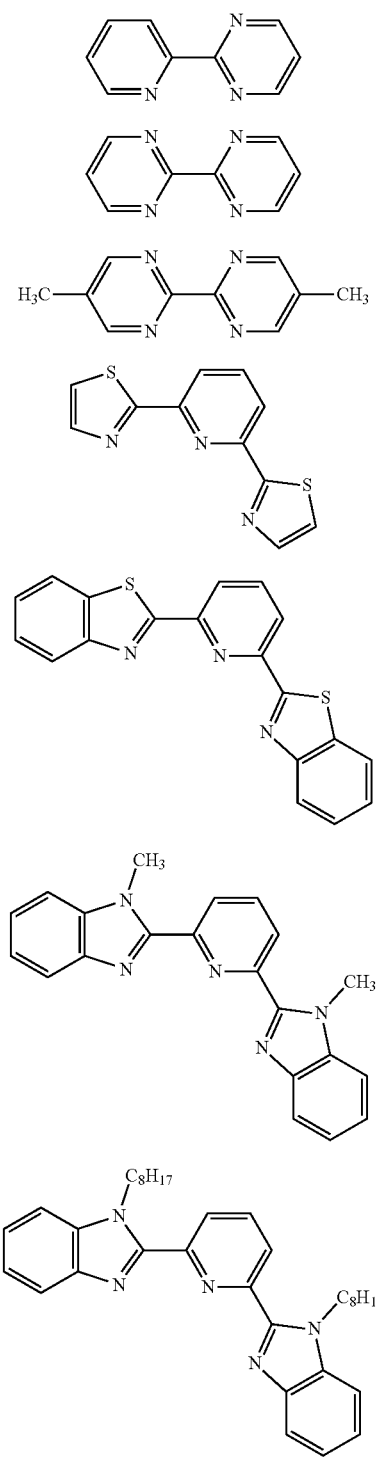

(A-22)
(A-23)
(A-24)
(A-25)
(A-26)
(A-27)
(A-28)

Specific examples of the anion in the metal complex salt include, but are not limited to, hydride ion (H$^-$), fluoride ion (F$^-$), chloride ion (Cl$^-$), bromide ion (Br$^-$), iodide ion (I$^-$), hydroxide ion (OH$^-$), cyanide ion (CN$^-$), nitrate ion (NO$_3^-$), nitrite ion (NO$_2^-$), hypochlorite ion (ClO$^-$), chlorite ion (ClO$_2^-$), chlorate ion (ClO$_3^-$), perchlorate ion (ClO$_4^-$), permanganate ion (MnO$_4^-$), acetate ion (CH$_3$COO$^-$), hydrogen carbonate ion (HCO$_3^-$), dihydrogen phosphate ion (H$_2$PO$_4^-$), hydrogen sulfate ion (HSO$_4^-$), hydrogen sulfide ion (HS$^-$), thiocyanate ion (SCN$^-$), tetrafluoroborate ion (BF$_4^-$), hexafluorophosphate ion (PF$_6^-$), tetracyanoborate ion (B(CN)$_4^-$), dicyanoamine ion (N(CN)$_2^-$), p-toluenesulfonate ion (TsO$^-$), trifluoromethylsulfonate ion (CF$_3$SO$_2^-$), bis(trifluoromethylsulfonyl)amine ion (N(SO$_2$CF$_3$)$_2^-$), tetrahydroxoaluminate ion ([AL(OH)$_4$]$^-$ or [Al(OH)$_4$(H$_2$O)$_2$]$^-$), dicyanoargentate(I) ion ([Ag(CN)$_2$]$^-$), tetrahydroxochromate(III) ion ([Cr(OH)$_4$]$^-$), tetrachloroaurate(III) ion ([AuCl$_4$]$^-$), oxide ion (O$_2^-$), sulfide ion (S$_2^-$), peroxide ion (O$_2^{2-}$), sulfate ion (SO$_4^{2-}$), sulfite ion (SO$_3^{2-}$), thiosulfate ion (S$_2$O$_3^{2-}$), carbonate ion (CO$_3^{2-}$), chromate ion (CrO$_4^{2-}$), dichromate ion (Cr$_2$O$_7^{2-}$), hydrogen phosphate ion (HPO$_4^{2-}$), tetrahydroxozincate(II) ion ([Zn(OH)$_4$]$^{2-}$), tetracyanozincate(II) ion ([Zn(CN)$_4$]$^{2-}$), tetrachlorocuprate (II) ion ([CuCl$_4$]$^{2-}$), phosphate ion, (PO$_4^{3-}$), hexacyanoferrate(III) ion ([Fe(CN)$_6$]$^{3-}$), bis(thiosulfato)argentate(I) ion ([Ag(S$_2$O$_3$)$_2$]$^{3-}$), and hexacyanoferrate(II) ion ([Fe(CN)$_6$]$^{4-}$).

Among these anions, tetrafluoroborate ion, hexafluorophosphate ion, tetracyanoborate ion, bis(trifluoromethylsulfonyl)amine ion, and perchlorate ion are preferable.

Each of the metal complex salts can be used alone or in combination with others. In particular, cobalt complex salts comprising tris-(2,2'-bipyridine)cobalt(II)di(bis(trifluoromethane)sulfonimide) (available from Dyenamo as a product name DN-C13) and tris-(2,2'-bipyridine)cobalt(III) tri(bis(trifluoromethane)sulfonimide) (available from Dyenamo as a product name DN-C14), and copper metal salts comprising bis-(2,9-dimethyl-1,10-phenanthroline) copper(I) bis(trifluoromethanesulfonyl)imide (available from Dyenamo as a product name DN-Cu01) and bis-(2,9-dimethyl-1,10-phenanthroline)copper(II)bis(trifluoromethanesulfonyl)imide chloride (available from Dyenamo as a product name DN-Cu02) are preferable. Preferably, the content rate of the inorganic hole transport material in the hole transport layer 6 is from 30% to 80% by mass, and more preferably from 50% to 70% by mass.

Preferably, the hole transport layer 6 has a configuration such that the hole transport layer 6 is entering pores of the porous electron transport layer 4. The average thickness of the hole transport layer 6 on the electron transport layer 4 is preferably 0.01 µm or more, more preferably from 0.1 to 10 µm.

In a case in which the hole transport layer 6 has a multi-layer structure, the hole transport layer disposed close to the second electrode 7 preferably contains a polymeric material. Examples of the polymeric material include known hole transport polymeric materials.

Specific examples of such hole transport polymeric materials include, but are not limited to, polythiophene compounds such as poly(3-n-hexylthiophene), poly(3-n-octyloxythiophene), poly(9,9'-dioctyl-fluorene-co-bithiophene), poly(3,3'''-didodecyl-quarter-thiophene), poly(3,6-dioctylthieno[3,2-b]thiophene), poly(2,5-bis(3-decylthiophene-2-yl)thieno[3,2-b]thiophene), poly(3,4-didecylthiophene-co-thieno[3,2-b]thiophene), poly(3,6-dioctylthieno[3,2-b]thiophene-co-thieno[3,2-b]thiophene), poly(3,6-dioctylthieno[3,2-b]thiophene-co-thiophene), and poly(3,6-dioctylthieno[3,2-b]thiophene-co-bithiophene);
polyphenylenevinylene compounds such as poly[2-methoxy-5-(2-ethylhexyloxy)-1,4-phenylenevinylene], poly[2-methoxy-5-(3,7-dimethyloctyloxy)-1,4-phenylenevinylene], and poly[2-methoxy-5-(2-ethylphenyloxy)-1,4-phenylenevinylene)-co-(4,4'-biphenylene-vinylene);
polyfluorene compounds such as poly(9,9'-didodecylfluorenyl-2,7-diyl), poly[(9,9-dioctyl-2,7-divinylenefluorene)-alt-co-(9,10-anthracene)], poly[(9,9-dioctyl-2,7-divinylenefluorene)-alt-co-(4,4'-biphenylene)], poly[(9,9-dioctyl-2,7-divinylenefluorene)-alt-co-(2-methoxy-5-(2-ethylhexyloxy)-1,4-phenylene)], and poly[(9,9-dioctyl-2,7-diyl)-co-(1,4-(2,5-dihexyloxy)benzene)]; polyphenylene compounds such as poly[2,5-dioctyloxy-1,4-phenylene] and poly[2,5-di(2-ethylhexyloxy-1,4-phenylene]; polyarylamine compounds such as poly[(9,9-dioctylfluorenyl-2,7-diyl)-alt-co-(N,N'-diphenyl)-N,N'-di(p-hexylphenyl)-1,4-diaminobenzene], poly[(9,9-dioctylfluorenyl-2,7-diyl)-alt-co-(N,N'-bis(4-octyloxyphenyl)benzidine-N,N'-(1,4-diphenylene)], poly[(N,N'-bis(4-octyloxyphenyl)benzidine-N,N'-(1,4-diphenylene)], poly[(N,N'-bis(4-(2-ethylhexyloxy)phenyl)benzidine-N,N'-(1,4-diphenylene)], poly[phenylimino-1,4-phenylenevinylene-2,5-dioctyloxy-1,4-phenylenevinylene-1,4-phenylene], poly[p-tolylimino-1,4-phenylenevinylene-2,5-di(2-ethylhexyloxy)-1,4-phenylenevinylene-1,4-phenylene], and poly[4-(2-ethylhexyloxy)phenylimino-1,4-biphenylene]; and polythiadiazole compounds such as poly[(9,9-dioctylfluorenyl-2,7-diyl)-alt-co-(1,4-benzo(2,1',3)thiadiazole] and poly(3,4-didecylthiophene-co-(1,4-benzo(2,1',3)thiadiazole).

Among these materials, polythiophene compounds and polyarylamine compounds are preferable for carrier mobility and ionization potential.

An additive may be further added to the organic hole transport material.

Specific examples of the additive include, but are not limited to, iodine; metal iodides such as lithium iodide, sodium iodide, potassium iodide, cesium iodide, calcium iodide, copper iodide, iron iodide, and silver iodide; iodine salts of quaternary ammonium compounds such as tetraalkylammonium iodide and pyridinium iodide; metal bromides such as lithium bromide, sodium bromide, potassium bromide, cesium bromide, and calcium bromide; bromine salts of quaternary ammonium compounds such as tetraalkylammonium bromide and pyridinium bromide; metal chlorides such as copper chloride and silver chloride; metal acetates such as copper acetate, silver acetate, and palladium acetate; metal sulfates such as copper sulfate and zinc sulfate; metal complexes such as ferrocyanate-ferricyanate and ferrocene-ferricinium ion; sulfur compounds such as sodium polysulfide and alkyl thiol-alkyl disulfide; viologen dye; hydroquinones; ion liquids described in Inorg. Chem. 35 (1996) 1168 such as 1,2-dimethyl-3-n-propyl imidazolinium iodide, 1-methyl-3-n-hexyl imidazolinium iodide, 1,2-dimethyl-3-ethyl imidazolium trifluoromethane sulfonate, 1-methyl-3-butyl imidazolium nonafluorobutyl sulfonate, and 1-methyl-3-ethyl imidazolium bis(trifluoromethyl) sulfonylimide; basic compounds such as pyridine, 4-t-butyl pyridine, and benzimidazole; and lithium compounds such as lithium trifluoromethane sulfonylimide and lithium diisopropylimide.

It is considered that, in the hole transport layer 6, the basic compound A is mainly present near the interface between the electron transport layer 4 and the hole transport layer 6 and suppresses reverse electron transfer from the electron transport layer 4 (i.e., electron transfer from the electron transport layer 4 to the hole transport layer 6). It is also considered that the cation in the ionic compound B is mainly present near the interface between the electron transport layer 4 and the hole transport layer 6, and the anion in the ionic compound B is doped in the hole transport layer 6. Under high-temperature environments, preferably, not only crystallization of the hole transport layer 6 itself but also the contact interface between the hole transport layer 6 and the electron transport layer 4 (and the photosensitizing compound 5) are properly controlled. This is because voltage reduction may be caused when short circuit or resistance increase occurs at the contact interface and/or a defective hole conducting path generates due to crystallization.

In the present embodiment, the basic compound A represented by the following formula (1) and the ionic compound B represented by the following formula (2) are added to the hole transport layer 6. Due to this configuration, the internal resistance of the photoelectric conversion element becomes much higher and therefore current loss under weak light (such as indoor light) is reduced and the open voltage becomes higher. As a result, under high-temperature environments, crystallization of the hole transport layer 6 can be suppressed and the contact interface between the electron transport layer 4 and the hole transport layer 6 can be properly maintained, thus advantageously suppressing voltage reduction.

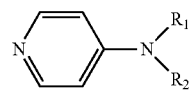

Formula (1)

In the formula (1), each of $R_1$ and $R_2$ independently represents an alkyl group or an aromatic hydrocarbon group, or $R_1$ and $R_2$ share bond connectivity to form a nitrogen-containing heterocyclic ring.

Specific examples of the basic compound A represented by the formula (1) include, but are not limited to, the following compounds represented by the respective formulae (1-1) to (1-9).

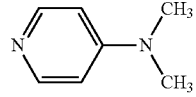

Formula (1-1)

J31.394G

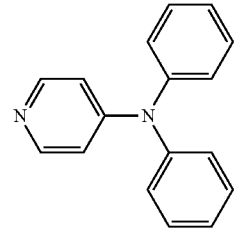

Formula (1-2)

J2.748.250C

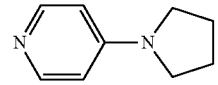

Formula (1-3)

J174K

Formula (1-4)

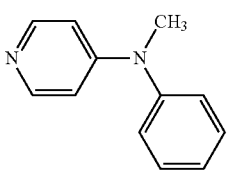

J880.4591

Formula (1-5)

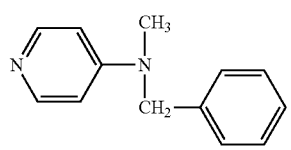

J1.983.963J

Formula (1-6)

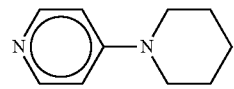

Formula (1-7)

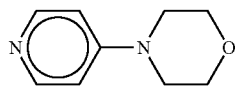

Formula (1-8)

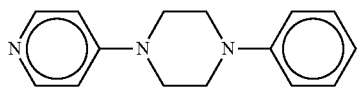

Formula (1-9)

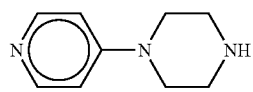

The combination of alphabets and numerals attached to each structural formula, if any, represents the compound number defined in the chemical substance database "Japan Chemical Substance Dictionary" created by Japan Science and Technology Agency.

The compound represented by the formula (1-1) itself is conventionally known. It is also known that some of the compounds represented by the formula (1) are used as a basic compound for liquid-state dye-sensitized solar cells using an iodine electrolyte.

However, it is known that when the above basic compound is used for the conventional liquid-state dye-sensitized solar cell using an iodine electrolyte, the short-circuit current density is notably reduced, while the open voltage is maintained, thereby significantly degrade photoelectric conversion property.

On the other hand, when the basic compound A represented by the formula (1) is used for a solid-state dye-sensitized solar cell comprising the above organic hole transport material in the hole transport layer 6, the amount of decrease in short-circuit current density can be reduced and the open voltage can be increased, thereby providing excellent photoelectric conversion property. Such a solar cell has a distinctive advantage in performing photoelectric conversion under weak light, such as indoor light.

Preferably, the content of the basic compound A represented by the formula (1) in the hole transport layer 6 is from 1 to 20 parts by mass, more preferably from 5 to 15 parts by mass, based on 100 parts by mass of the organic hole transport material.

The hole transport layer 6 further contains the ionic compound B represented by the following formula (2).

Formula (2)

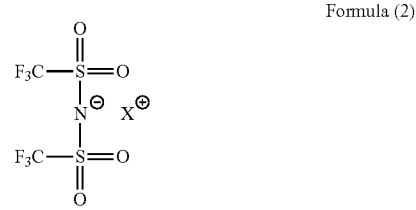

In the formula (2), X$^+$ represents a counter cation.

Preferred examples of X in the ionic compound B represented by the formula (2) include, but are not limited to, nitrogen-containing heterocyclic compounds (e.g., imidazolium and pyrrolidinium) and alkali metals (e.g., Li, Na, and K). In particular, Li is most preferable.

Specific preferred examples of the ionic compound B represented by the formula (2) include lithium (fluorosulfonyl)(trifluoromethanesulfonyl)imide (also known as Li-FTFST). Lithium (fluorosulfonylX)(trifluoromethanesulfonyl)imide is a known compound (described in J. Phys. Chem, C 2013, 117, 24206-24212), but any application of this compound to solar cells has not been reported.

Even when the ionic compound B represented by the formula (2) is used, the contact interface between the electron transport layer 4 and the hole transport layer 6 cannot be sufficiently controlled and the occurrence of short circuit and resistance increase cannot be sufficiently suppressed under high-temperature environments, unless the basic compound A represented by the formula (1) is used in combination.

When the basic compound A represented by the formula (1) and the ionic compound B represented by the formula (2) are used in combination, crystallization of the hole transport layer 6 can be suppressed and the contact interface between the electron transport layer 4 and the hole transport layer 6 can be properly maintained, thus suppressing voltage reduction.

The molar ratio (A:B) between the basic compound A and the ionic compound B in the hole transport layer 6 is from 20:1 to 10:10, and more preferably from 10:1 to 10:4.

For the purpose of improving conductivity, an oxidant may be added for converting a part of the organic hole transport material into radical cations.

Specific examples of the oxidant include, but are not limited to, tris(4-bromophenyl)aminium hexachloroantimonate, silver hexafluoroantimonate, nitrosonium tetrafluoroborate, silver nitrate, and cobalt complex compounds.

Not all the organic hole transport materials need to be oxidized by the oxidant and only a part of them may be oxidized. The oxidant having been added to the system may be either taken out or kept therein.

The organic hole transport layer may be directly formed on the electron transport layer 4 that is carrying the photosensitizing material. The organic hole transport layer is not limited in production method and can be produced by, for example, a method of forming a thin layer in vacuum, such as vacuum deposition, or a wet film-forming method. For reducing production cost, a wet film-forming method in which a coating liquid is applied onto the electron transport layer 4 is preferable.

In this wet film-forming method, how to apply the coating liquid is not particularly limited. For example, the coating liquid may be applied by means of dipping, spraying, wire bar, spin coating, roller coating, blade coating, gravure coating, or wet printing such as relief, offset, gravure, intaglio, rubber plate, and screen printings. Alternatively, the layer may be formed in a supercritical fluid or a subcritical fluid having lower temperature and pressure than the critical point.

The supercritical fluid is not limited in substance so long as it exists as a non-cohesive high-density fluid at temperatures and pressures beyond the region where gases and liquids can coexist (i.e., the critical point), without cohering even under compression, while having a temperature equal to or above the critical temperature and a pressure equal to or above the critical pressure. Specifically, those having a low critical temperature are preferable.

Specific examples of the supercritical fluid include, but are not limited to, carbon monoxide, carbon dioxide, ammonia, nitrogen, water, alcohol solvents (e.g., methanol, ethanol, and n-butanol), hydrocarbon solvents (e.g., ethane, propane, 2,3-dimethylbutane, benzene, and toluene), halogen solvents (e.g., methylene chloride and chlorotrifluoromethane), and ether solvents (e.g., dimethyl ether). Among these substances, carbon dioxide, having a supercritical pressure of 7.3 MPa and a supercritical temperature of 31° C., is preferable, because carbon dioxide is easy to put into a supercritical state and easy to handle owing to its non-combustibility.

Each of these fluids can be used alone or in combination with others.

The subcritical fluid is not limited in substance so long as it exists as a high-pressure liquid at temperatures and pressures near the critical point.

The above-described substances preferable for the supercritical fluid are also preferable for the subcritical fluid.

The supercritical fluid is not limited in critical temperature and critical pressure, but preferably has a critical temperature of from −273° C. to 300° C., more preferably from 0° C. to 200° C.

In addition, an organic solvent and/or entrainer can be used in combination with the supercritical fluid or subcritical fluid. Addition of an organic solvent and/or entrainer facilitates adjustment of solubility in the supercritical fluid.

Specific examples of the organic solvent include, but are not limited to, ketone solvents such as acetone, methyl ethyl ketone, and methyl isobutyl ketone; ester solvents such as ethyl formate, ethyl acetate, and n-butyl acetate; ether solvents such as diisopropyl ether, dimethoxyethane, tetrahydrofuran, dioxolan, and dioxane; amide solvents such as N,N-dimethylformamide, N,N-dimethylacetamide, and N-methyl-2-pyrrolidone; halogenated hydrocarbon solvents such as dichloromethane, chloroform, bromoform, methyl iodide, dichloroethane, trichloroethane, trichloroethylene, chlorobenzene, o-dichlorobenzene, fluorobenzene, bromobenzene, iodobenzene, and 1-chloronaphthalene; and hydrocarbon solvents such as n-pentane, n-hexane, n-octane, 1,5-hexadiene, cyclohexane, methylcyclohexane, cyclohexadiene, benzene, toluene, o-xylene, m-xylene, p-xylene, ethylbenzene, and cumene.

After the organic hole transport material is provided on the first electrode 2 having the electron transport material covered with the photosensitizing material thereon, a press processing may be conducted. The press processing brings the organic hole transport material into a more intimate contact with the porous electrode, thus improving efficiency.

The press processing may be a press molding using a flat plate, such as an IR tablet pelletizer, or a roll press using a roller. The pressure in the press processing is preferably 10 $kgf/cm^2$ or more, and more preferably 30 $kgf/cm^2$ or more. The pressing time is preferably within 1 hour. Heat can be applied during the press processing, if necessary.

It is possible that a release material is sandwiched between the presser and the electrode in the press processing.

Specific examples of the release material include, but are not limited to, fluorine resins such as polytetrafluoroethylene, polychlorotrifluoroethylene, tetrafluoroethylene-hexafluoropropylene copolymer, perfluoroalkoxyfluoro resin, polyvinylidene fluoride, ethylene-tetrafluoroethylene copolymer, ethylene-chlorotrifluoroethylene copolymer, and polyvinyl fluoride.

After the press processing and before provision of an opposite electrode, a metal oxide may be provided between the organic hole transport material and the second electrode. Specific examples of the metal oxide include, but are not limited to, molybdenum oxide, tungsten oxide, vanadium oxide, and nickel oxide. Among these materials, molybdenum oxide is preferable.

There is no limit on how to provide the metal oxide on the organic hole transport material. For example, a method of forming a thin layer in vacuum, such as sputtering and vacuum deposition, and a wet film-forming method can be employed.

Specifically, a wet film-forming method in which a paste dispersing a powder or sol of a metal oxide is applied to the hole transport layer 6 is preferable.

In this wet film-forming method, how to apply the paste is not particularly limited. For example, the paste may be applied by means of dipping, spraying, wire bar, spin coating, roller coating, blade coating, gravure coating, or wet printing such as relief, offset, gravure, intaglio, rubber plate, and screen printings.

The film thickness is preferably from 0.1 to 50 nm and more preferably from 1 to 10 nm.

Second Electrode

The second electrode 7 is formed on the hole transport layer 6 or the metal oxide described above.

The second electrode 7 may have a similar configuration to the first electrode. However, the substrate is not necessary so long as the strength and sealing performance are sufficiently secured.

Specific examples of usable materials for the second electrode 7 include, but are not limited to, metals such as platinum, gold, silver, copper, and aluminum; carbon compounds such as graphite, fullerene, carbon nanotube, and graphene; conductive metal oxides such as ITO, FTO, and ATO; and conductive polymers such as polythiophene and polyaniline.

The second electrode 7 is not limited in thickness. The second electrode 7 may be formed of a single material or a mixture of two or more materials.

The second electrode 7 can be formed on the hole transport layer 6 by means of, for example, coating, lamination, vapor deposition, CVD (chemical vapor deposition), or bonding, depending on the types of materials constituting the second electrode 7 and the hole transport layer 6.

To function as a photoelectric conversion element, preferably, at least one of the first electrode 2 and the second electrode 7 is substantively transparent. In the present embodiment, preferably, the first electrode 2 is transparent to allow solar light to enter from the first electrode 2 side. In this case, the second electrode 7 is preferably made of a light reflective material such as metal-deposited or conductive-oxide-deposited glass or plastic, or a metallic thin film.

It is also effective to provide an antireflective layer on the solar light incoming side.

Use Application

The photoelectric conversion element in accordance with some embodiments of the present invention refers to an element that converts optical energy into electric energy or an element that converts electric energy into optical energy. The photoelectric conversion element may be used for solar cells and photodiodes. In particular, the photoelectric conversion element is preferably used for solar cells.

The photoelectric conversion element in accordance with some embodiments of the present invention is applicable to power-supply devices when used in combination with a circuit board that controls a generated current. Specific examples of instruments using such a power-supply device include, but are not limited to, electronic desk calculators and watches. In addition, such a power-supply device using the photoelectric conversion element in accordance with some embodiments of the present invention is applicable to cell phones, electronic organizers, and electronic papers. In addition, such a power-supply device using the photoelectric conversion element in accordance with some embodiments of the present invention can also be used as an auxiliary power supply for lengthening the continuous operating time of charging-type or battery-type electronic devices. Furthermore, the photoelectric conversion element can be used as a substitute of a primary battery that is combined with a secondary battery, as a stand-alone power supply for sensors.

EXAMPLES

Further understanding can be obtained by reference to certain specific examples which are provided herein for the purpose of illustration only and are not intended to be limiting.

Example 1

Preparation of Titanium Oxide Semiconductor Electrode (Electron Transport Layer)

A dense hole blocking layer 3 was formed with titanium oxide on an ITO glass substrate, in which an ITO conductive film serving as the first electrode 2 and a glass substrate serving as the substrate 1 are integrated, by reactive sputtering of oxygen gas using a titanium metal target.

The first electrode 2 was laser-etched by a laser device to obtain a 10-cell serial substrate.

Next, 3 g of titanium oxide (P90 available from Nippon Aerosil Co., Ltd.), 0.2 g of acetylacetone, and 0.3 g of a surfactant (polyoxyethylene octyl phenyl ether, available from Wako Pure Chemical Industries, Ltd.) were subjected to a bead mill treatment, along with 5.5 g of water and 1.0 g of ethanol, for 12 hours, thus obtaining a titanium oxide dispersion liquid. The resulting titanium oxide dispersion liquid was mixed with 1.2 g of a polyethylene glycol (#20,000 available from Wako Pure Chemical Industries, Ltd.) to prepare a paste.

The paste was applied onto the hole blocking layer 3 so as to have an average thickness of 1.5 μm, dried at room temperature, and then burnt in the air at 500° C. for 30 minutes, thus forming a porous electron transport layer 4. As a result, a titanium oxide semiconductor electrode was prepared.

Preparation of Photoelectric Conversion Element

The titanium oxide semiconductor electrode prepared above was dipped in a 0.5 mM acetonitrile/t-butanol (1/1 by volume) solution of the compound D358 (available from Mitsubishi Paper Mills Limited) represented by the formula (iii) and left to stand for 1 hour in a dark place, so that the photosensitizing compound 5 was adsorbed thereto.

Next, 22.38 mg (150 mM) of the basic compound A represented by the formula (1-3) (i.e., 4-pyrrolidinopyridine available from Tokyo Chemical Industry Co., Ltd.) and 9.62 mg (40 mM) of the ionic compound B (i.e., lithium (fluorosulfonyl)(trifluoromethanesulfonyl)imide, also known as Li-FTFSI, available from Provisco CS) were added to 1 mL of a chlorobenzene solution of 183.8 mg of an organic hole transport material represented by the following formula (4) (i.e., 9,9'-([1,1'-biphenyl]-4,4'-diyl)bis(N3,N3,N6,N6-tetrakis(4-methoxyphenyl)-9H-carbazole-3,6-diamine), also known as X51, available from Dyenamo). Thus, a hole transport layer coating liquid was prepared having a molar ratio (A:B) of 10:2.67.

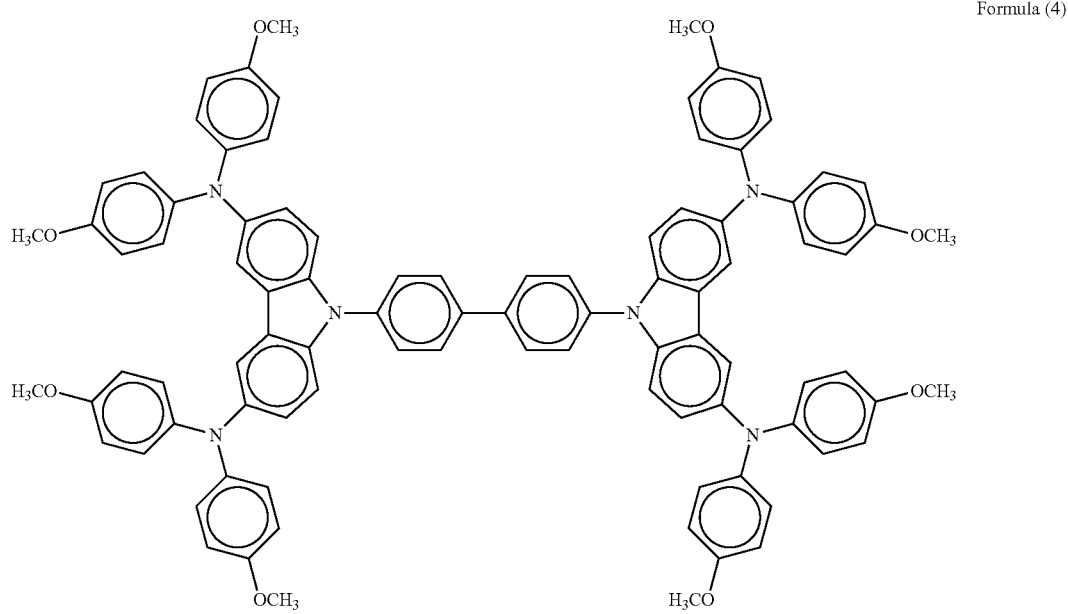

Formula (4)

Next, the semiconductor electrode carrying the photosensitizing compound was coated with the hole transport layer coating liquid by spin coating, thus forming the hole transport layer 6. As a result, a photoelectric conversion layer was formed.

Next, a silver layer having a thickness of 100 nm was vacuum-deposited on the photoelectric conversion layer using a mask having a 6-cell serial pattern to form the second electrode 7. Thus, a photoelectric conversion element was prepared.

Evaluation of Photoelectric Conversion Element

Figure 2:
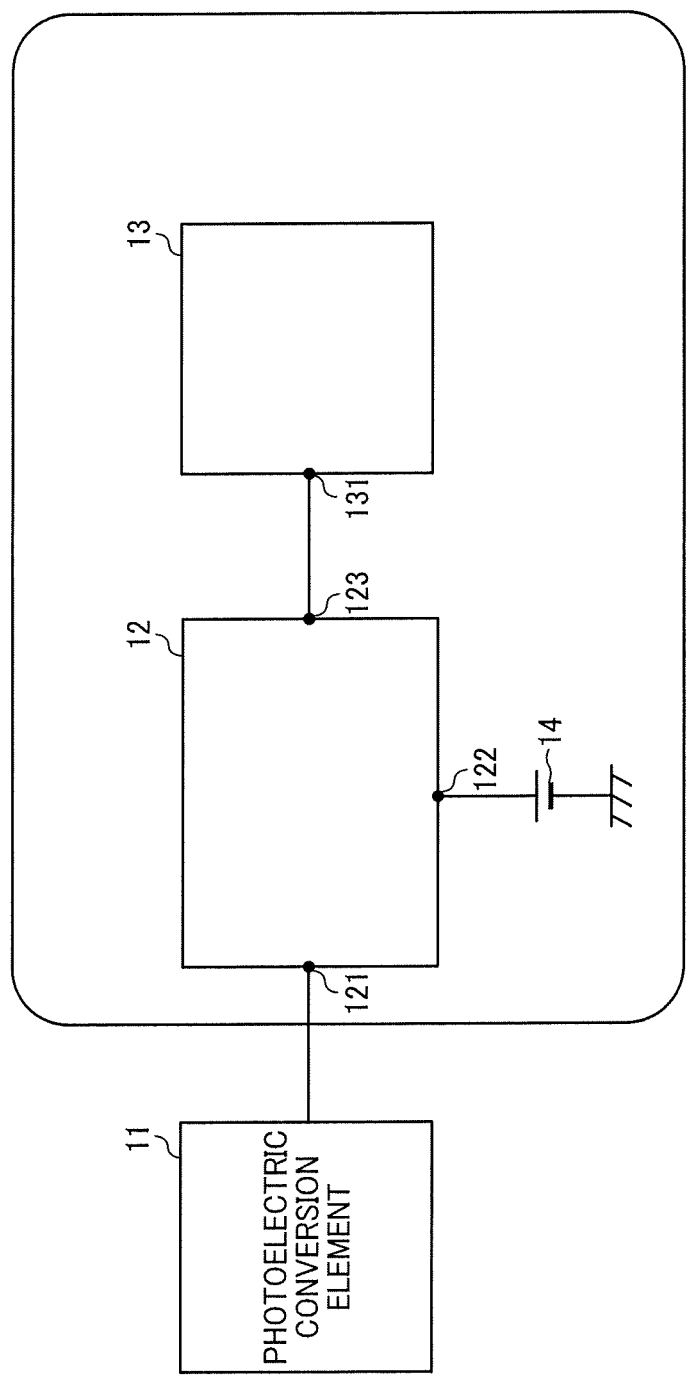
FIG. 2 is a schematic diagram of a secondary battery charging circuit used in Examples.

The above-prepared photoelectric conversion element was connected to a secondary battery charging circuit illustrated in FIG. 2. Referring to FIG. 2, a PMIC (power management integrated circuit) 12 receives power output from a photoelectric conversion element 11 and outputs stabilized power required by an external circuit 13. Numerals 121, 122, and 123 respectively denote an environmental power input terminal, a battery terminal, and a stabilized power output terminal. The circuit 13 is put into operation by the power output from the PMIC 12. The circuit 13 comprises a sensor and a communication circuit. A numeral 131 denote a power input terminal. A secondary battery 14 is charged by environmental power while the PMIC 12 is outputting a specifically stabilized power.

As the PMIC 12, LTC3331 available from Linear Technology Corporation was used. The output voltage of the PMIC 12 was set to 3.0 V, and the lockout voltage of the PMIC 12 was set to 45 V (at rising) and 4 V (at falling). While the PMIC 12 was outputting a voltage of 3.0 V±3% and the photoelectric conversion element 11 was outputting a voltage of 4.0 V or greater, the secondary battery was charged.

Whether the secondary battery 14 had been charged or not was determined by confirming a voltage increase by monitoring the voltage of the secondary battery 14 with a data logger (midi LOGGER GL900 available from Graphtec Corporation).

Secondary battery charing ability was evaluated by connecting the photoelectric conversion element to the circuit and left to to stand for 500 hours under high-temperature (100° C.) environments and white LED irradiation (2,000 Lux, 0.48 mW/cm$^2$).

Evaluation Criteria

A: Capable of charging. Voltage was 4.5 V or greater.

B: Capable of charging.

C: Incapable of charging.

As a photoelectric conversion property, open voltage $V_{OC}$ was also evaluated. The evaluation results are shown in Table 1.

In measuring the photoelectric conversion property (open voltage $V_{OC}$), an LED desk lamp (CDS-90α available from Cosmotechno Co., Ltd. in Study Mode) having high color rendering property was used as a white LED lamp, and a solar cell evaluating system (As-510-PV03 available from NF Corporation) was used as an evaluation device. The evaluation results measured before the photoelectric conversion element was heated are also shown in Table 1.

Example 2

The procedure in Example 1 was repeated except for replacing the hole transport material with another organic hole transport material represented by the following formula (5) (i.e., 2,2',7,7'-tetrakis(N,N-di-p-methoxyphenylamino)-9,9'-spirobifluorene, also known as SHT-263, available from Merck). The evaluation results are shown in Table 1.

Formula (5)

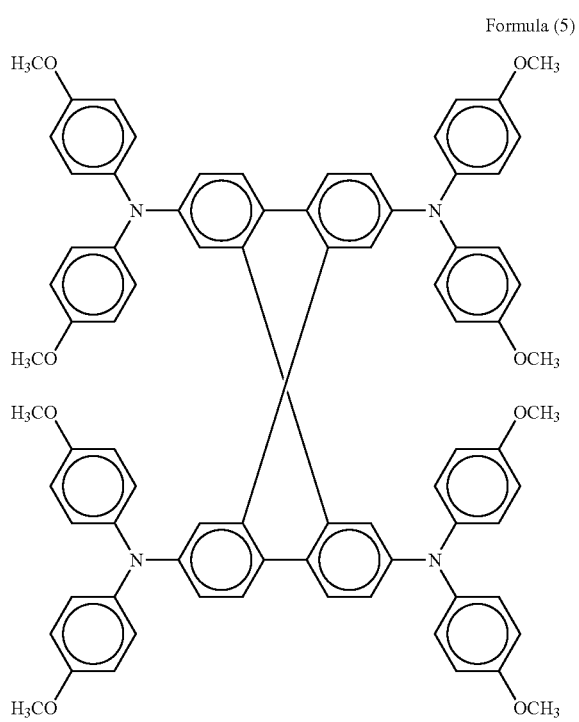

Example 3

The procedure in Example 1 was repeated except for replacing the hole transport material with another organic hole transport material represented by the following formula (6) (i.e., LT-S9170, also known as HTM1, available from Luminescence Technology Corp.).
The evaluation results are shown in Table 1.

Formula (6)

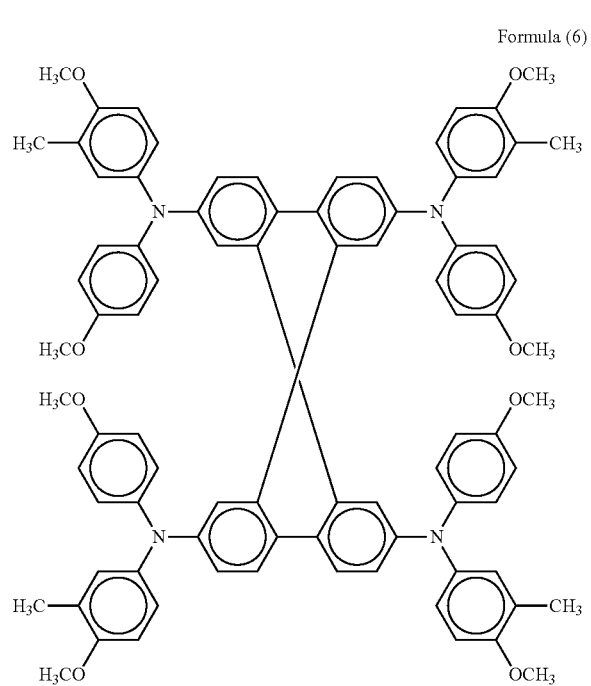

Examples 4 to 10

The procedure in Example 1 was repeated except for changing the molar ratio (A:B) between the basic compound A and the ionic compound B as according to Table 1. The evaluation results are shown in Table 1.

Example 11

Preparation of Photoelectric Conversion Element

The titanium oxide semiconductor electrode prepared in Example 1 was dipped in a 0.5 mM acetonitrile/t-butanol (1/1 by volume) solution of the photosensitizing material D358 (available from Mitsubishi Paper Mills Limited) represented by the formula (iii) and left to stand for 1 hour in a dark place, so that the photosensitizing material was adsorbed thereto.

The semiconductor electrode carrying the photosensitizing material was coated with 1 ml of a chlorobenzene solution of 152 mg (200 mM) of bis-(2,9-dimethyl-1,10-phenanthroline)copper(I) bis(trifluoromethanesulfonyl)imide (available from Dyenamo as a product name DN-Cu01), 39.8 mg (50 mM) of bis-(2,9-dimethyl-1,10-phenanthroline)copper(II)bis(trifluoromethanesulfonyl)imide chloride (available from Dyenamo as a product name DN-Cu02), 74.6 mg (500 mM) of the basic compound A represented by the formula (1-3) (i.e., 4-pyrrolidinopyridine available from Tokyo Chemical Industry Co., Ltd.), and 24.05 mg (100 mM) of the ionic compound B (i.e., lithium (fluorosulfonyl)(trifluoromethanesulfonyl)imide available from Provisco CS), by spin coating. Further, a silver film having a thickness of about 100 nm was formed thereon by vacuum vapor deposition. Thus, a solid-state dye-sensitized solar cell element was prepared.

Comparative Example 1

The procedure in Example 1 was repeated except for replacing the basic compound A with 4-tertiary-butyl pyridine (TBP available from Tokyo Chemical Industry Co., Ltd.). The evaluation results are shown in Table 1.

Comparative Example 2

The procedure in Example 1 was repeated except for replacing the ionic compound B with lithium bis(trifluoromethanesulfonyl)imide (also known as Li-TFSI, available from Kanto Chemical Co., Inc.). The evaluation results are shown in Table 1.

Comparative Example 3

The procedure in Example 1 was repeated except for replacing the ionic compound B with lithium bis(fluorosulfonyl)imide (also known as Li-FSI, available from KISHIDA CHEMICAL Co., Ltd.). The evaluation results are shown in Table 1.

Comparative Example 4

The procedure in Example 1 was repeated except for replacing the ionic compound B with a mixture of lithium bis(trifluoromethanesulfonyl)imide (also known as Li-TFSI, available from Kanto Chemical Co., Inc.) and lithium bis(fluorosulfonyl)imide (also known as Li-FSI, available from KISHIDA CHEMICAL Co., Ltd.). The evaluation results are shown in Table 1.

TABLE 1

| | Basic Compound A | Ionic Compound B | Hole Transport Material | Molar Ratio (A:B) | Initial Stage $V_{OC}$ | Initial Stage Charging Ability | After Heating at 100° C. $V_{OC}$ | After Heating at 100° C. Decrease Rate (%) | After Heating at 100° C. Charging Ability |
|---|---|---|---|---|---|---|---|---|---|
| Example 1 | (1-3) | Li-FTFSI | X51 | 10:2.67 | 5.28 | A | 4.32 | 18.2 | B |
| Example 2 | (1-3) | Li-FTFSI | SHT-263 | 10:2.67 | 5.52 | A | 4.68 | 15.2 | A |
| Example 3 | (1-3) | Li-FTFSI | HTM1 | 10:2.67 | 5.58 | A | 4.86 | 12.9 | A |
| Example 4 | (1-1) | Li-FTFSI | HTM1 | 10:2.67 | 5.46 | A | 4.83 | 11.5 | A |
| Example 5 | (1-6) | Li-FTFSI | HTM1 | 10:2.67 | 5.40 | A | 4.89 | 9.4 | A |
| Example 6 | (1-3) | Li-FTFSI | HTM1 | 10:0.8 | 5.94 | A | 4.47 | 24.7 | B |
| Example 7 | (1-3) | Li-FTFSI | HTM1 | 10:1 | 5.88 | A | 4.92 | 16.3 | A |
| Example 8 | (1-3) | Li-FTFSI | HTM1 | 10:2 | 5.82 | A | 4.83 | 17.0 | A |
| Example 9 | (1-3) | Li-FTFSI | HTM1 | 10:4 | 5.43 | A | 4.53 | 16.6 | A |
| Example 10 | (1-3) | Li-FTFSI | HTM1 | 10:5 | 5.22 | A | 4.14 | 20.7 | B |
| Example 11 | (1-3) | Li-FTFSI | DN-Cu01/DN-Cu02 | 10:2 | 5.28 | A | 4.86 | 8.0 | A |
| Comparative Example 1 | TBP | Li-FTFSI | X51 | 10:2.67 | 5.01 | A | 3.54 | 29.3 | C |
| Comparative Example 2 | (1-3) | Li-TFSI | X51 | 10:2.67 | 5.34 | A | 3.30 | 38.2 | C |
| Comparative Example 3 | (1-3) | Li-FSI | X51 | 10:2.67 | 5.10 | A | 3.72 | 27.1 | C |
| Comparative Example 4 | (1-3) | Li-TSFI/Li-FSI | X51 | 10:2.67 | 5.28 | A | 3.66 | 30.7 | C |

The results shown in Table 1 indicate that, in the photoelectric conversion elements of Examples 1 to 11, voltage reduction was suppressed under high-temperature environments and secondary battery charging ability was maintained. Therefore, these photoelectric conversion elements are usable without changing the settings of the PMIC. The reason for such results is considered that crystallization of the hole transport layer was suppressed and the contact interface between the electron transport layer and the hole transport layer was kept in a good condition.

By contrast, in Comparative Examples 1 to 4 in which the molar ratio (A:B) between the basic compound A and the ionic compound B was out of the specified range, desired properties were not obtained.

It is clear from the evaluation results that the photoelectric conversion elements in accordance with some embodiments of the present invention are capable of suppressing voltage reduction and charging secondary battery regardless of environment temperature.

Numerous additional modifications and variations are possible in light of the above teachings. It is therefore to be understood that, within the scope of the above teachings, the present disclosure may be practiced otherwise than as specifically described herein. With some embodiments having thus been described, it will be obvious that the same may be varied in many ways. Such variations are not to be regarded as a departure from the scope of the present disclosure and appended claims, and all such modifications are intended to be included within the scope of the present disclosure and appended claims.

The invention claimed is:

1. A photoelectric conversion element comprising:

a substrate;

a first electrode;

an electron transport layer comprising a photosensitizing compound;

a hole transport layer comprising:

a basic compound A represented by the following formula (1):

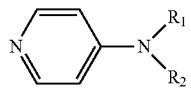

Formula (1)

where each of $R_1$ and $R_2$ independently represents an alkyl group or an aromatic hydrocarbon group, or $R_1$ and $R_2$ share bond connectivity to form a nitrogen-containing heterocyclic ring; and an ionic compound B represented by the following formula (2):

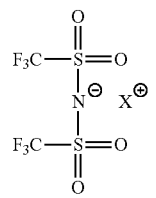

Formula (2)

where $X^+$ represents a counter cation; and a second electrode, wherein a molar ratio (A:B) between of the basic compound A and the ionic compound B is from 10:1 to 10:4.

2. The photoelectric conversion element of claim 1, further comprising a hole blocking layer.

3. The photoelectric conversion element of claim 1, wherein the ionic compound B comprises lithium (fluorosulfonyl)(trifluoromethanesulfonyl)imide.

4. The photoelectric conversion element of claim 1, wherein $R_1$ and $R_2$ share bond connectivity to form a nitrogen-containing heterocyclic ring.

5. The photoelectric conversion element of claim 1, wherein the hole transport layer further comprises an organic hole transport material represented by the following formula (3):

Formula (3)

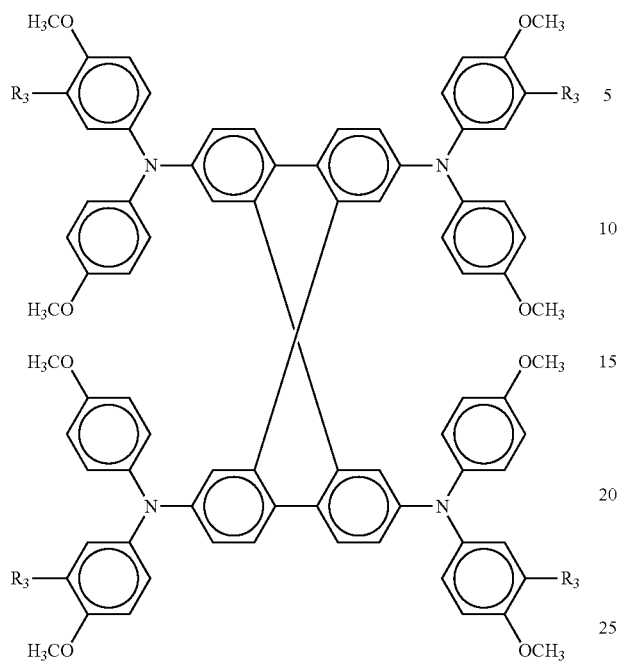

where R₃ represents hydrogen atom or methyl group.

6. The photoelectric conversion element of claim 1, wherein the hole transport layer contains an inorganic hole transport material comprising a complex salt of a metal selected from the group consisting of cobalt, iron, nickel, and copper.

7. A solar cell comprising the photoelectric conversion element of claim 1.

8. A photoelectric conversion element comprising:
   a substrate;
   a first electrode;
   an electron transport layer comprising a photosensitizing compound;
   a hole transport layer comprising:
      a basic compound A represented by the following formula (1):

Formula (1)

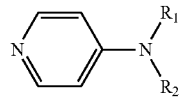

where each of $R_1$ and $R_2$ independently represents an alkyl group or an aromatic hydrocarbon group, or $R_1$ and $R_2$ share bond connectivity to form a nitrogen-containing heterocyclic ring: and an ionic compound B represented by the following formula (2):

Formula (2)

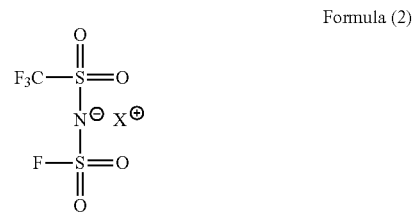

where $X^+$ represents a counter cation; and
a second electrode,
wherein:
ionic compound B comprises lithium (fluorosulfonyl)(trifluoromethanesulfonyl)imide;
basic compound A comprises one selected from 4-pyrrolidinopyridine,

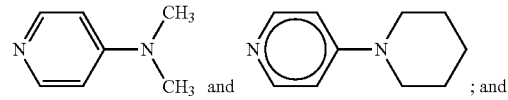

a molar ratio (A:B) between of the basic compound A and the ionic compound B is from 20:1 to 1:1.

9. The photoelectric conversion element of claim 8, wherein the hole transport layer further comprises an organic hole transport material selected from the following formulae (4), (5) and (6):

Formula (4)

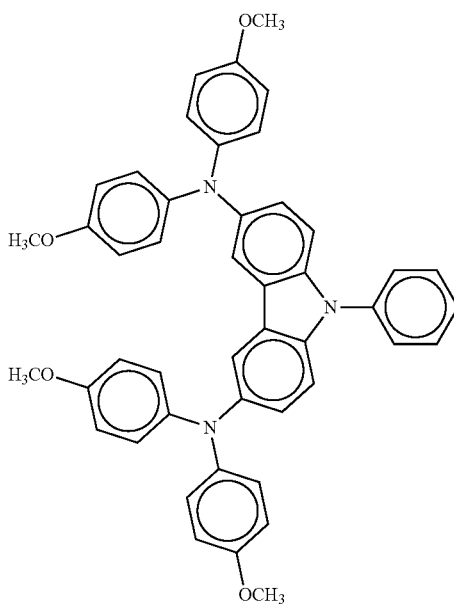

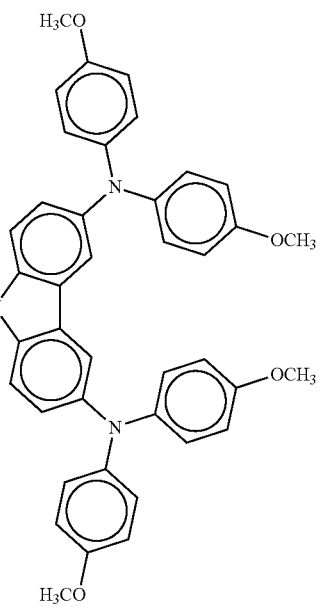

-continued
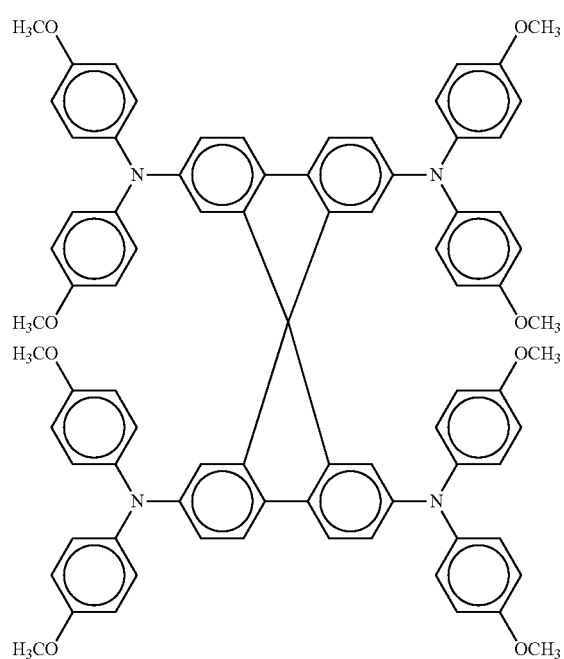
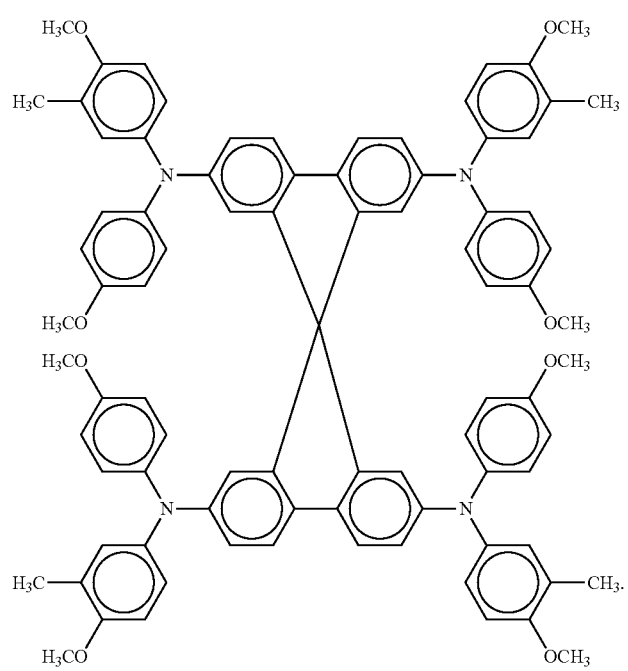
Formula (5)
Formula (6)
10. The photoelectric conversion element of claim 8, wherein the hole transport layer contains an inorganic hole transport material comprising a complex salt of a metal selected from the group consisting of cobalt, iron, nickel, and copper.
11. A solar cell comprising the photoelectric conversion element of claim 8.
* * * * *